United States Patent
Ishibashi et al.

(10) Patent No.: US 12,128,550 B2
(45) Date of Patent: Oct. 29, 2024

(54) VACUUM TRANSFER DEVICE AND METHOD FOR CONTROLLING VACUUM TRANSFER DEVICE

(71) Applicant: TOKYO ELECTRON LIMITED, Tokyo (JP)

(72) Inventors: Seiji Ishibashi, Nirasaki (JP); Hayato Itomi, Nirasaki (JP); Hiroyuki Takahashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 292 days.

(21) Appl. No.: 17/761,361

(22) PCT Filed: Sep. 11, 2020

(86) PCT No.: PCT/JP2020/034506
§ 371 (c)(1),
(2) Date: Mar. 17, 2022

(87) PCT Pub. No.: WO2021/054260
PCT Pub. Date: Mar. 25, 2021

(65) Prior Publication Data
US 2022/0288796 A1   Sep. 15, 2022

(30) Foreign Application Priority Data
Sep. 20, 2019   (JP) .............................. 2019-172276

(51) Int. Cl.
B25J 15/06   (2006.01)
B25J 9/16    (2006.01)
(Continued)

(52) U.S. Cl.
CPC ......... *B25J 15/0625* (2013.01); *B25J 9/1679* (2013.01); *B25J 9/1694* (2013.01); *B25J 11/0095* (2013.01); *B25J 21/00* (2013.01)

(58) Field of Classification Search
CPC ..... B25J 15/0625; B25J 21/00; B25J 11/0095
See application file for complete search history.

(56) References Cited

U.S. PATENT DOCUMENTS

2012/0164840 A1 * 6/2012 Tanaka .............. H01L 21/67051
  257/E21.228
2019/0276936 A1   9/2019 Kamata

FOREIGN PATENT DOCUMENTS

JP   2001-345241   *  6/2001
JP   2001-338967   * 12/2001
(Continued)

*Primary Examiner* — Henry T Crenshaw
(74) *Attorney, Agent, or Firm* — Nath, Goldberg & Meyer; Jerald L. Meyer; Tanya E. Harkins (57) ABSTRACT

A vacuum transfer device, which is arranged between a process chamber and a load lock chamber and transfers a substrate between the process chamber and the load lock chamber, includes a container, a transfer device, an exhaust device, a dew-point meter, and a control device. The container is connected to each of the process chamber and the load lock chamber via a gate valve. The transfer device is provided inside the container and transfers the substrate between the process chamber and the load lock chamber. The exhaust device exhausts a gas in the container. The dew-point meter measures a dew-point temperature of the gas in the container. The control device determines whether a process is ready to be executed, based on the dew-point temperature measured by the dew-point meter, and when the process is ready to be executed, notifies that fact to a user of the vacuum transfer device.

8 Claims, 5 Drawing Sheets

(51) Int. Cl.
 *B25J 11/00* (2006.01)
 *B25J 21/00* (2006.01)

(56) References Cited

FOREIGN PATENT DOCUMENTS

| | | |
|---|---|---|
| JP | 2001-338967 A | 12/2001 |
| JP | 2001-345241 A | 12/2001 |
| JP | 2005-123308 A | 5/2005 |
| JP | 2013-115065 A | 6/2013 |
| JP | 2019-161097 A | 9/2019 |
| KR | 1020170085977 A | 7/2017 |

\* cited by examiner

VACUUM TRANSFER DEVICE AND METHOD FOR CONTROLLING VACUUM TRANSFER DEVICE

This is a National Phase Application filed under 35 U.S.C. 371 as a national stage of PCT/JP2020/034506, filed Sep. 11, 2020, an application claiming the benefit of Japanese Application No. 2019-172276, filed Sep. 20, 2019, the content of each of which is hereby incorporated by reference in its entirety.

TECHNICAL FIELD

Various aspects and embodiments of the present disclosure relate to a vacuum transfer device and a method of controlling the vacuum transfer device.

BACKGROUND

In recent years, with the miniaturization of wiring patterns, the quality of wiring may deteriorate due to the oxidation of wirings formed on a substrate by the moisture adhering to the substrate. Therefore, in a FOUP (Front Opening Unified Pod) for transferring and storing the substrate, the FOUP in which the substrate is accommodated is filled with a nitrogen gas so as to prevent the moisture from adhering to the substrate. Further, since the interior of a vacuum transfer device is controlled to become a low pressure, the amount of moistures adhering to the substrate is not so large in the process of being transferred in the vacuum transfer device.

However, since the substrate is exposed to the atmosphere until it is taken out from the FOUP and transferred to the vacuum transfer device and until it is taken out from the vacuum transfer device and accommodated in the FOUP, a large amount of moisture adhere to the substrate.

In order to avoid this, a technique is known to provide a mini-environment transfer device between the FOUP and the vacuum transfer device to keep a transfer path between the FOUP and the vacuum transfer device in a low humidity state (see, e.g., Patent Document 1).

PRIOR ART DOCUMENT

Patent Document

Patent Document 1: Japanese Laid-Open Publication No. 2013-115065

The present disclosure provides some embodiments of a vacuum transfer device capable of reducing moisture adhering to a substrate, and a method of controlling the vacuum transfer device.

SUMMARY

According to one aspect of the present disclosure, there is provided a vacuum transfer device that is arranged between a process chamber and a load lock chamber and transfers a substrate between the process chamber and the load lock chamber, including a container, a transfer device, an exhaust device, a dew-point meter, and a control device. The container is connected to each of the process chamber and the load lock chamber via a gate valve. The transfer device is provided inside the container and transfers the substrate between the process chamber and the load lock chamber. The exhaust device exhausts a gas in the container. The dew-point meter measures a dew-point temperature of the gas in the container. The control device determines whether or not a process is ready to be executed, based on the dew-point temperature measured by the dew-point meter, and when the process is ready to be executed, notifies that fact to a user of the vacuum transfer device.

According to various aspects and embodiments of the present disclosure, it is possible to reduce moisture adhering to a substrate.

DETAILED DESCRIPTION

Embodiments of a vacuum transfer device and a method of controlling the vacuum transfer device, disclosed in the present disclosure, will now be described in detail with reference to the drawings. The following embodiments do not limit the disclosed vacuum transfer device and method of controlling the vacuum transfer device.

The vacuum transfer device is sealed after being opened to the atmosphere, and a gas in the vacuum transfer device is exhausted, so that an internal pressure of the vacuum transfer device is reduced. Therefore, even when the concentration of the gas in the vacuum transfer device is lowered by the exhaust, the ratio of moisture in the gas in the vacuum transfer device is the same as that in the ambient air. As the wiring pattern becomes finer, the characteristics of wirings may change even with a slight amount of moisture adhering to the wirings. Therefore, as the wiring pattern becomes further finer, the wiring characteristics may change in the process of transferring a substrate in the vacuum transfer device.

Therefore, the present disclosure provides a technique capable of further reducing the moisture adhering to the substrate.

[Film Forming System 100]

Figure 1:
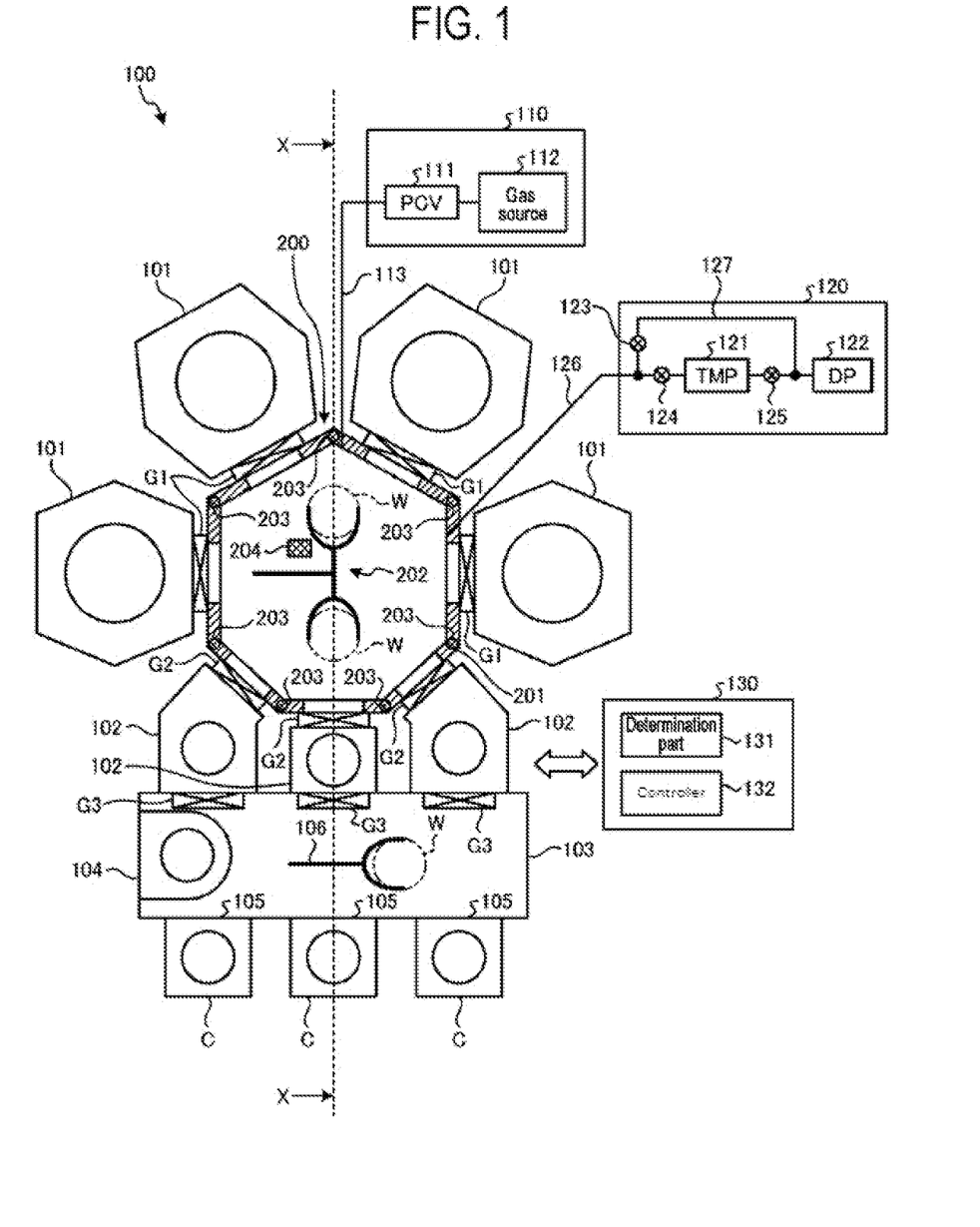
FIG. 1 is a view showing an example of a configuration of a film forming system according to an embodiment.
Figure 2:
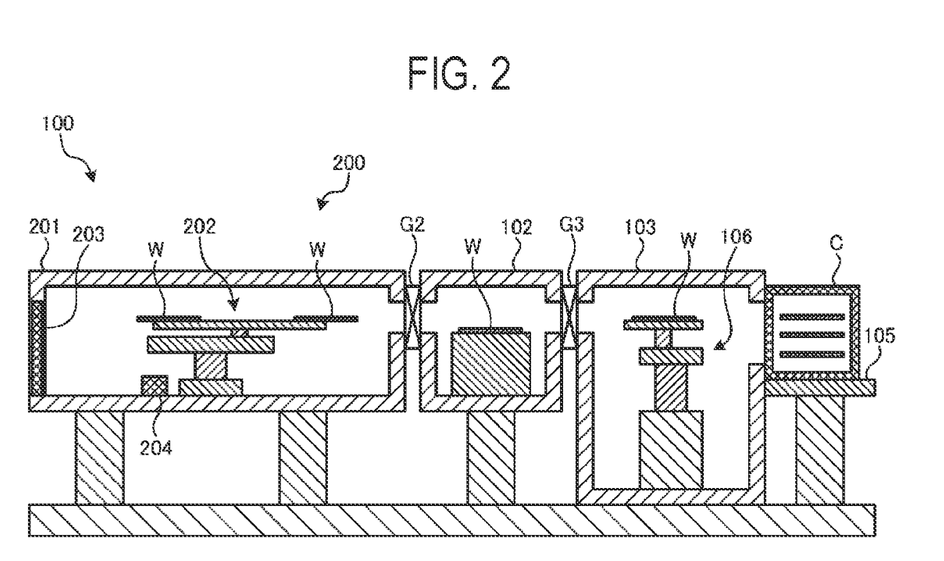
FIG. 2 is an X-X cross-sectional view showing an example of a vacuum transfer device, a load lock chamber, and an atmosphere transfer chamber.

FIG. 1 is a schematic view showing an example of a film forming system 100 according to an embodiment of the present disclosure. FIG. 2 is an X-X cross-sectional view showing an example of a vacuum transfer device 200, a load lock chamber 102, and an atmosphere transfer chamber 103. The X-X cross section of FIG. 1 corresponds to FIG. 2. The film forming system 100 is a multi-chamber type vacuum processing system. The film forming system 100 includes a plurality of process chambers 101, a plurality of load lock chambers 102, an atmosphere transfer chamber 103, a gas supply device 110, an exhaust device 120, a control device 130, and a vacuum transfer device 200.

The plurality of process chambers 101 are connected to four sidewalk of the vacuum transfer device 200 having a heptagonal planar shape via gate valves (31, respectively. Each process chamber 101 performs a process such as film formation, etching, or modification on a substrate W loaded into the interior of the process chamber 101 via the vacuum transfer device 200. In the present embodiment, four process chambers 101 are connected to the four sidewalls of the vacuum transfer device 200 having the heptagonal planar shape, respectively, but the number of process chambers 101 connected to the vacuum transfer device 200 may be fewer or more.

The plurality of load lock chambers 102 are connected to three sidewalls of the vacuum transfer device 200 via gate valves G2, respectively. The atmosphere transfer chamber 103 is connected to the load lock chambers 102 via gate valves G3, respectively. Each of the load lock chambers 102 switches the atmosphere between an air atmosphere and a vacuum atmosphere when the substrate W is transferred between the atmosphere transfer chamber 103 and the vacuum transfer device 200. In the present embodiment, three load lock chambers 102 are connected to the three sidewalls of the vacuum transfer device 200, respectively, but the number of load lock chambers 102 connected to the vacuum transfer device 200 may be fewer or more.

The vacuum transfer device 200 has a container 201, a transfer device 202, a plurality of heaters 203, and a dew-point meter 204. The transfer device 202 is, for example, a robot arm and transfers the substrate W between each process chamber 101 and each load lock chamber 102. For example, the transfer device 202 unloads an unprocessed substrate W from the load lock chamber 102 and loads the same into the process chamber 101. Further, for example, the transfer device 202 unloads a processed substrate W from the process chamber 101 and load the same into the process chamber 101 which performs another process on the substrate W. Further, for example, the transfer device 202 unloads a processed substrate W from a process chamber 101 and loads the same into the load lock chamber 102.

Each heater 203 has, for example, a rod shape and is embedded in a sidewall of the container 201 to heat the sidewall of the container 201. As a result, the wall surface of the container 201 is heated, so that water molecules adsorbed on the wall surface of the container 201 are easily separated. Further, the heater 203 may be embedded in the floor or ceiling of the container 201 to heat the floor or ceiling of the container 201. The supply and cutoff of power to the heater 203 are controlled by the controller 132 in the control device 130.

The dew-point meter 204 is arranged inside the container 201 and measures a dew-point temperature $T_d$ of a gas in the container 201. In the present embodiment, the dew-point meter 204 is a capacitance-type dew-point meter. Information of the dew-point temperature $T_d$ measured by the dew-point meter 204 is output to the control device 130.

The exhaust device 120 is connected to the container 201 via a pipe 126. The exhaust device 120 includes a TMP (Turbo Molecular Pump) 121, a DP (Dry Pump) 122, a valve 123, a valve 124, and a valve 125. An intake port of the IMP 121 is connected to the pipe 126 via the valve 124, and an exhaust port of the IMP 121 is connected to the DP 122 via the valve 125. Further, a pipe 127 is connected between the pipe 126 and a pipe between the valve 125 and the DP 122, and the valve 123 is provided in the pipe 127. The DP 122 can exhaust the gas in the container 201 up to a vacuum degree of about several Torr. On the other hand, the TMP 121 can exhaust the gas in the container 201 to a vacuum degree of 1 Torr or less. The TMP 121 consumes more power than the DP 122. The IMP 121, the DP 122, the valve 123, the valve 124, and the valve 125 are controlled by the controller 132 in the control device 130.

A gas supply device 110 is connected to the container 201 via a pipe 113. The gas supply device 110 includes a PCV (Pressure Control Valve) 111 and a gas source 112. The gas source 112 is a source of an inert gas such as a nitrogen gas or a noble gas. The PCV 111 controls a supply amount of the inert gas into the container 201 so that an internal pressure of the container 201 becomes a predetermined pressure. The PCV 111 is controlled by the controller 132 in the control device 130.

A plurality of ports 105 for installing carriers (FOUPs and the like) C for accommodating the substrates W are provided on the side surface of the atmosphere transfer chamber 103. An alignment chamber 104 for aligning the substrate W is provided inside the atmosphere transfer chamber 103. Further, a transfer device 106 such as a robot arm is provided inside the atmosphere transfer chamber 103. The transfer device 106 transfers the substrate W between the carrier C, the load lock chamber 102, and the alignment chamber 104. A down-flow of low humidity dry air is formed inside the atmosphere transfer chamber 103.

The control device 130 has a memory, a processor, and an input/output interface. The memory stores a program executed by the processor, and a recipe including conditions for each process. The processor executes the program read from the memory to control each part of the film forming system 100 via the input/output interface based on the recipe stored in the memory.

The processor of the control device 130 realizes the functions of a determination part 131 and the controller 132 by executing the program read from the memory. The determination part 131 acquires the dew-point temperature $T_d$ from the dew-point meter 204 when the container 201 of the vacuum transfer device 200 is sealed after being opened to the atmosphere for setup, maintenance, or the like. Then, the determination part 131 determines whether or not the acquired dew-point temperature $T_d$ is equal to or lower than a predetermined first temperature $T_{d1}$. When it is determined that the dew-point temperature $T_d$ is equal to or lower than the first temperature $T_{d1}$, the determination part 131 notifies the controller 132 of that fact.

Further, after notifying the controller 132 that the dew-point temperature $T_d$ is equal to or lower than the first temperature $T_{d1}$, the determination part 131 continuously acquires the dew-point temperature $T_d$ from the dew-point meter 204. Then, the determination part 131 determines whether or not the dew-point temperature $T_d$ is higher than a predetermined second temperature $T_{d2}$. When it is determined that the dew-point temperature $T_d$ is higher than the second temperature $T_{d2}$, the determination part 131 notifies the controller 132 of that fact. In the present embodiment, the second temperature $T_{d2}$ is higher than the first temperature $T_{d1}$. As another embodiment, the first temperature $T_{d1}$ and the second temperature $T_{d2}$ may be the same temperature.

The controller 132 controls each part of the film forming system 100. For example, the controller 132 controls the PCV 111, the TMP 121, the DP 122, the valve 123, the valve 124, the valve 125, the heaters 203, the gate valves G1, the gate valves G2, and so on in response to a notification from the determination part 131. The details of the control by the controller 132 will be described in a flowchart to be described later.

[Preparation Before Start of Process]

Figure 3:
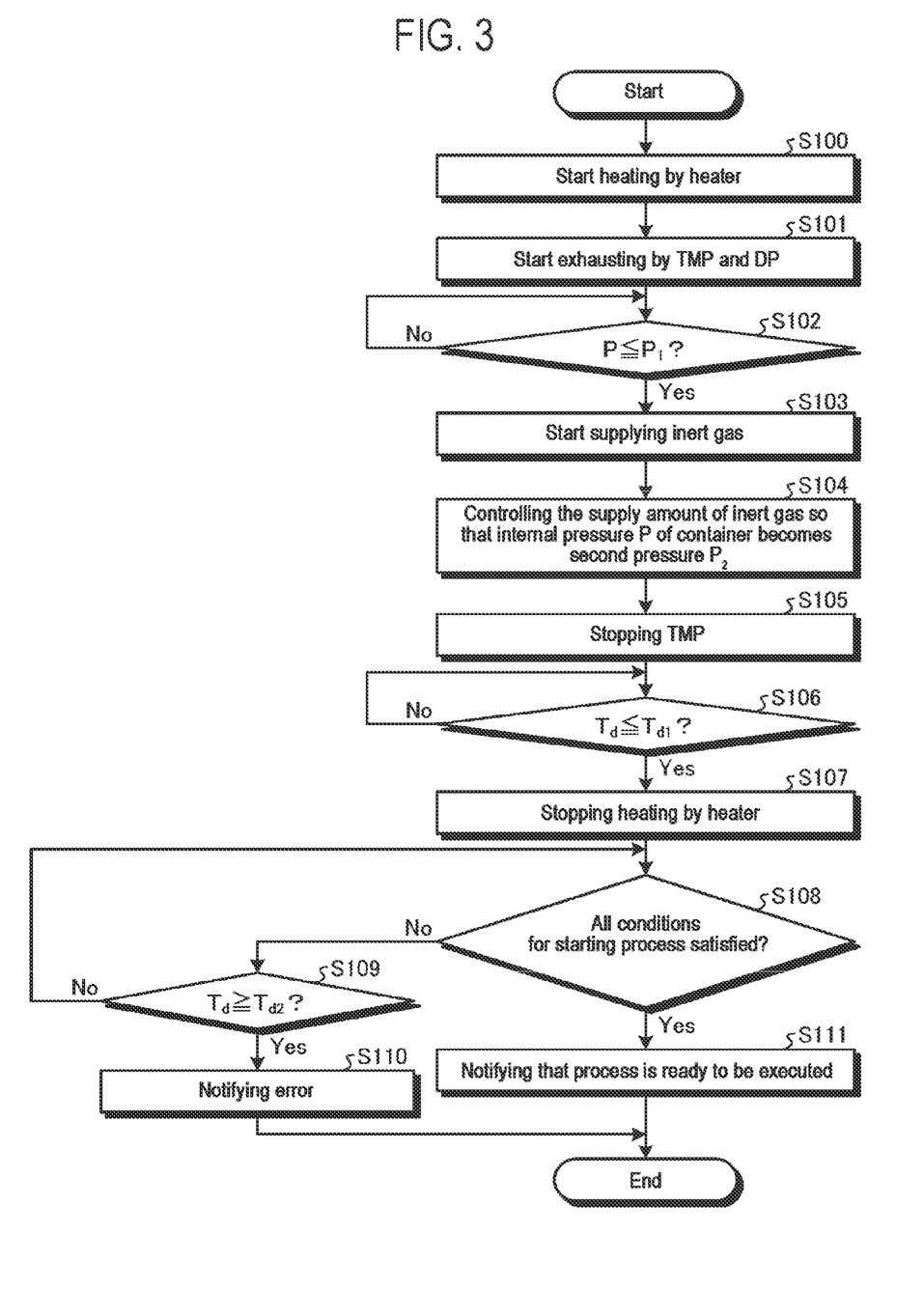
FIG. 3 is a flowchart showing an example of control of the vacuum transfer device before the start of a process.

FIG. 3 is a flowchart showing an example of control of the vacuum transfer device 200 before the start of a process. For example, when the interior of the vacuum transfer device 200 is sealed after being opened to the atmosphere for setup, maintenance, or the like, the control device 130 starts a process shown in this flowchart.

First, the controller 132 starts heating the container 201 by the heater 203 by starting the supply of power to each heater 203 (S100).

Subsequently, the controller 132 starts exhausting by the TMP 121 and the DP 122 (S101). In step S101, the controller 132 controls the valve 123 to be closed, controls the valve 124 and the valve 125 to be opened, and operates the TMP 121 and the DP 122. As a result, the gas in the container 201 is exhausted, and an internal pressure P of the container 201 is lowered.

Subsequently, the controller 132 refers to a measured value of a pressure gauge (not shown) arranged inside the container 201 to determine whether or not the internal pressure P of the container 201 is equal to or lower than a predetermined first pressure $P_1$ (S102). The first pressure $P_1$ is, for example, a pressure of less than 0.01 Torr. When the internal pressure P of the container 201 is higher than the first pressure $P_1$ ("No" in S102), the process of step S102 is executed again.

On the other hand, when the internal pressure P of the container 201 is equal to or lower than the first pressure $P_1$ ("Yes" in S102), the PCV 111 is controlled to start supplying an inert gas into the container 201 (S103). Then, the controller 132 controls the PCV 111 to control the supply amount of the inert gas so that the internal pressure P of the container 201 becomes a predetermined second pressure $P_2$ (S104). The second pressure $P_2$ is, for example, a pressure in a range of 1 to 10 Torr.

Then, the controller 132 controls the valve 123 to be opened, controls the valve 124 to be closed, and stops the operation of the TMP 121 (S105). By stopping the operation of the TMP 121, the power consumption of the vacuum transfer device 200 can be reduced.

Here, although the container 201 is hermetically sealed, ambient air may slightly enter the container 201 via a seal member arranged at a connection portion between the container 201 and the process chamber 101, a connection portion between the container 201 and the load lock chamber 102, and the like. When the ambient air enters the container 201, some of water molecules contained in the ambient air adhere to the inner surface of the container 201. As a result, even when the gas in the container 201 is exhausted, the amount of moisture in the container 201 may not drop below a certain level.

Therefore, in the present embodiment, the gas in the container 201 is exhausted and the inert gas is supplied into the container 201. This suppresses moisture molecules contained in the ambient air that has entered the container 201 from adhering to the inner surface of the container 201. As a result, the moisture molecules contained in the ambient air that have entered the container 201 can be quickly exhausted by the exhaust device 120, thereby further reducing the amount of moisture in the container 201.

Subsequently, the determination part 131 determines whether or not the dew-point temperature $T_d$ is equal to or lower than the first temperature $T_{d1}$ (S106). When it is determined that the dew-point temperature $T_d$ is higher than the first temperature $T_{d1}$ ("No" in S106), the process shown in step S106 is executed again.

On the other hand, when it is determined that the dew-point temperature $T_d$ is equal to or lower than the first temperature $T_{d1}$ ("Yes" in S106), the determination part 131 notifies the controller 132 that the dew-point temperature $T_d$ is equal to or lower than the first temperature $T_{d1}$. The controller 132 stops the heating of the container 201 by the heater 203 by stopping the supply of power to each heater 203 (S107). As a result, the power consumption of the vacuum transfer device 200 can be reduced.

Subsequently, the controller 132 determines whether or not all the conditions for starting the process are satisfied (S108). The conditions for starting the process include a condition that the pressure adjustment and temperature control in each process chamber 101 are completed, and a condition that the carriers C are set in the ports 105, and so on, in addition to the condition that the dew-point temperature $T_d$ in the container 201 is equal to or lower than the first temperature $T_{d1}$.

When at least some of the conditions for starting the process are not satisfied ("No" in S108), the determination part 131 determines whether or not the dew-point temperature $T_d$ is equal to or higher than the second temperature $T_{d2}$ (S109). When it is determined that the dew-point temperature $T_d$ is lower than the second temperature $T_{d2}$ ("No" in S109), the process shown in step S108 is executed again.

On the other hand, when the dew-point temperature $T_d$ is equal to or higher than the second temperature $T_{d2}$ ("Yes" in S109), the determination part 131 notifies the controller 132 that the dew-point temperature $T_d$ is equal to or higher than the second temperature $T_{d2}$. It can be considered that the fact that the dew-point temperature $T_d$ is equal to or higher than the second temperature $T_{d2}$ means that the amount of ambient air entered the container 201 has increased due to some reason such as weakened scalability of the seal member that maintains the airtightness of the container 201. Therefore, the controller 132 notifies an error to a user of the film forming system 100 (S110), The controller 132 notifies the error to the user of the film forming system 100, for example by displaying on a display device (not shown) that the dew-point temperature $T_d$ has reached the second temperature 112 or higher. Then, the control device 130 ends the process shown in this flowchart.

On the other hand, when all the conditions for starting the process are satisfied ("Yes" in S108), the controller 132 notifies the user of the film forming system 100 that the process is ready to be executed, for example by displaying on the display device (not shown) that the process start has been ready (S111). Then, the control device 130 ends the process shown in this flowchart.

[Control of Vacuum Transfer Device 200 During Process Execution]

Figure 4:
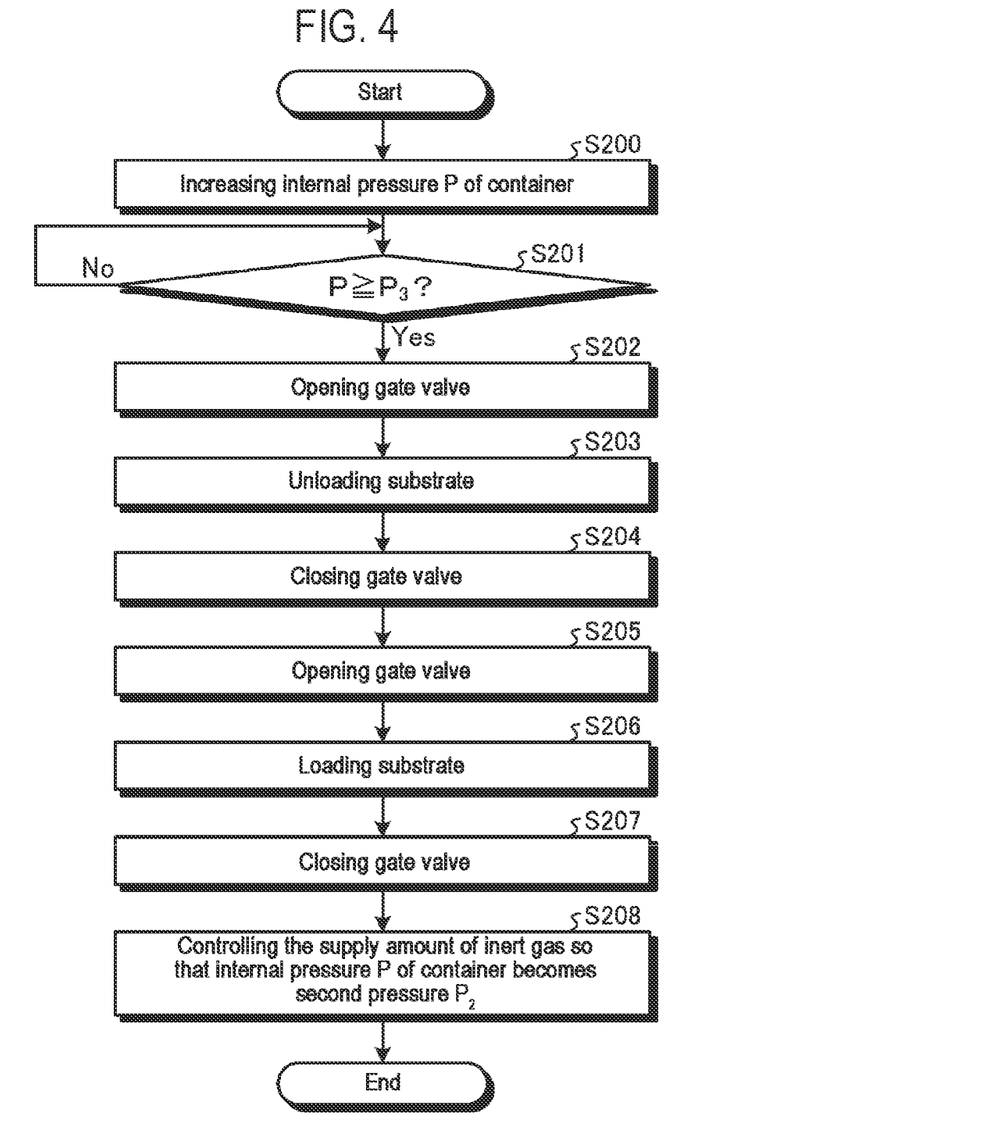
FIG. 4 is a flowchart showing an example of control of the vacuum transfer device when opening a gate valve between a process chamber and the vacuum transfer device in a case in which a process in one process chamber is completed.

FIG. 4 is a flowchart showing an example of control of the vacuum transfer device 200 when opening a gate valve G1 between a process chamber 101 and the vacuum transfer device 200 when a process in one process chamber 101 is completed. For example, when the execution of a specific process for the substrate W in one process chamber 101 is completed, the control device 130 starts a process shown in this flowchart.

First, the controller 132 controls the PCV 111 so as to increase the internal pressure P of the container 201 (S200). Then, the controller 132 refers to a measured value of the pressure gauge (not shown) arranged inside the container 201 to determine whether or not the internal pressure P of the container 201 is equal to or higher than a predetermined third pressure $P_3$ (S201). The third pressure $P_3$ is a pressure higher than the internal pressure of the process chamber 101 and lower than the atmospheric pressure. When it is determined that the internal pressure P of the container 201 is lower than the first pressure $P_3$ ("No" in S201), the process shown in step S201 is executed again.

On the other hand, when it is determined that the internal pressure of the container 201 is equal to or higher than the third pressure $P_3$ ("Yes" in S201), by controlling the gate valve G1 between the process chamber 101 in which the specific process is completed and the container 201 to be opened, the controller 132 opens the gate valve G1 (S202). Then, the controller 132 controls the transfer device 202 so as to unload the substrate W from the interior of the process chamber 101 (S203). Then, by controlling the gate valve G1 between the process chamber 101 and the container 201 to be closed, the controller 132 closes the gate valve G1 (S204).

In this way, in the present embodiment, the controller 132 controls the internal pressure of the container 201 to be higher than the internal pressure of the process chamber 101 before opening the gate valve G1. As a result, when the gate valve G1 is opened, particles, residual gases, and the like inside the process chamber 101 are suppressed from entering the container 201. As a result, the particles generated inside the process chamber 101 are suppressed from entering the other process chambers 101 via the container 201.

Subsequently, by controlling a gate valve between the transfer destination of the substrate W and the container 201 to be opened, the gate valve is opened (S205). In step S205, when another process is executed by another process chamber 101 for the substrate W, the gate valve G1 between the another process chamber 101 and the container 201 is opened. Further, when the substrate W is accommodated in the carrier C, the gate valve G2 between the load lock chamber 102 and the container 201 is opened.

Then, the controller 132 controls the transfer device 202 so as to load the substrate W into another process chamber 101 or the load lock chamber 102 (S206). Then, the controller 132 closes the gate valve (S207).

Subsequently, the controller 132 controls the PCV 111 to control the supply amount of the inert gas so that the internal pressure P of the container 201 becomes the predetermined second pressure $P_2$ (S208). Then, the control device 130 ends the process shown in this flowchart.

The embodiment has been described above. As described above, the vacuum transfer device 200 in the present embodiment is arranged between the process chamber 101 and the load lock chamber 102 and transfers the substrate W between the process chamber 101 and the load lock chamber 102. The vacuum transfer device 200 includes the container 201, the transfer device 202, the exhaust device 120, the dew-point meter 204, and the control device 130. The container 201 is connected to the process chamber 101 and the load lock chamber 102 via the gate valves G1 and G2, respectively. The transfer device 202 is provided inside the container 201 and transfers the substrate W between the process chamber 101 and the load lock chamber 102. The exhaust device 120 exhausts the gas in the container 201. The dew-point meter 204 measures the dew-point temperature of the gas in the container 201. The control device 130 determines whether or not the process is ready to be executed, based on the dew-point temperature measured by the dew-point meter 204. When determining that the process is ready to be executed, the control device 130 notifies the fact to the user of the vacuum transfer device 200. As a result, the vacuum transfer device 200 can reduce the moisture adhering to the substrate W.

Further, in the above-described embodiment, the control device 130 includes the determination part 131 and the controller 132. The determination part 131 determines whether or not the dew-point temperature $T_d$ of the gas in the container 201 is equal to or lower than the predetermined first temperature $T_{d1}$ after the interior of the container 201 is opened to the atmosphere and sealed again. When all of a plurality of predetermined conditions are satisfied, including as one condition that the dew-point temperature $T_d$ is determined to be equal to or lower than the first temperature $T_{d1}$ by the determination part 131, the controller 132 notifies the user of the vacuum transfer device 200 that the process is ready to be executed. As a result, the vacuum transfer device 200 can reduce the moisture adhering to the substrate W.

Further, in the above-described embodiment, when it is determined by the controller that the dew-point temperature $T_d$ is equal to or higher than the predetermined second temperature $T_{d2}$ while the process chamber 101 is processing the substrate W, the controller 132 notifies an error to the user of the vacuum transfer device 200. As a result, the vacuum transfer device 200 can prevent the substrate W from passing through the container 201 in a state in which the dew-point temperature $T_d$ in the container 201 is high.

Further, in the above-described embodiment, the container 201 is provided with the heater 203 for heating the inner wall surface of the container 201. Further, the controller 132 heats the inner wall surface of the container 201 by supplying the power to the heater 203 after the interior of the container 201 is opened to the atmosphere and sealed again. As a result, water molecules adhering to the inner wall surface of the container 201 can be quickly separated, thereby quickly reducing the moisture in the container 201.

Further, in the above-described embodiment, when it is determined by the determination part 131 that the dew-point temperature $T_d$ of the gas in the container 201 is equal to or lower than the first temperature $T_{d1}$, the controller 132 stops the heating of the inner wall surface of the container 201 by the heater 203 by stopping the supply of power to the heater 203. As a result, the power consumption of the vacuum transfer device 200 can be reduced.

Further, the vacuum transfer device 200 in the above-described embodiment further includes the gas supply device 110 that supplies the inert gas into the container 201. This suppresses water molecules contained in the ambient air, which has entered the container 201 via the seal member or the like, from adhering to the inner surface of the container 201.

Further, in the above-described embodiment, the gas supply device 110 includes the PCV 111, and the exhaust device 120 includes the TMP 121 and the DP 122. The controller 132 operates the IMP 121 and the DP 122 to exhaust the gas in the container 201. Then, when the internal pressure P of the container 201 is equal to or lower than the predetermined first pressure $P_1$, the controller 132 stops the operation of the TMP 121 and controls the PCV 111 so that the internal pressure of the container 201 becomes the second pressure $P_2$ higher than the first pressure $P_1$ in a state in which the DP 122 is operating. As a result, the moisture in the container 201 can be quickly reduced, and the power consumption of the vacuum transfer device 200 can be reduced.

Further, in the above-described embodiment, the controller 132 controls the PCV111 so that the internal pressure of the container 201 is higher than the internal pressure of the process chamber 101 before the gate valve G1 between the process chamber 101 and the container 201 is opened. As a result, when the gate valve G1 between the process chamber 101 and the container 201 is opened, particles, residual gases, and the like in the process chamber 101 are suppressed from entering the container 201.

Further, the method of controlling the vacuum transfer device 200 in the present embodiment includes the step of determining whether or not the dew-point temperature $T_d$ of the gas in the container 201 measured by the dew-point meter 204 provided inside the container 201 after the interior of the container 201 is opened to the atmosphere and sealed again is equal to or lower than the first temperature $T_{d1}$, and the step of notifying the user of the vacuum transfer device that the process is ready to be executed when all of a plurality of predetermined conditions are satisfied, including as one condition that the dew-point temperature $T_d$ is determined to be equal to or lower than the first temperature $T_{d1}$. As a result, the vacuum transfer device 200 can reduce the moisture adhering to the substrate W.

[Others]

The technique disclosed in the present disclosure is not limited to the above-described embodiment, and many modifications can be made within the scope of the gist thereof.

For example, in the above-described embodiment, it is determined whether or not the process is ready to be executed, based on the dew-point temperature $T_d$ measured by the dew-point meter 204 provided inside the container 201, but the disclosed technique not limited thereto. For example, an oxygen concentration meter for measuring the concentration of oxygen contained in the gas in the container 201 may be provided inside the container 201, and it may be determined whether or not the process is ready to be executed, based on the dew-point temperature $T_d$ and the oxygen concentration of the gas in the container 201.

For example, when the dew-point temperature $T_d$ of the gas in the container 201 is equal to or lower than the first temperature $T_{d1}$ and the oxygen concentration of the gas in the container 201 is equal to or lower than a first concentration, it may be determined that one of the plurality of conditions for starting the process is satisfied. Further, during the process execution, when the dew-point temperature $T_d$ of the gas in the container 201 is higher than the second temperature $T_{d2}$ or when the oxygen concentration of the gas in the container 201 is higher than a second concentration, an error may be notified to the user of the film forming system 100, and the process may be interrupted. As a result, oxidation of the substrate W by oxygen remaining in the vacuum transfer device 200 is also suppressed.

Further, in the above-described embodiment, the control of the dew-point temperature of the gas in the container 201 when the container 201 of the vacuum transfer device 200 is sealed after being opened to the atmosphere for setup, maintenance, or the like has been mainly described, but the disclosed technique is not limited thereto. For example, the control of the dew-point temperature in the container 201 may be executed even during the execution of the process for the substrate W.

Figure 5:
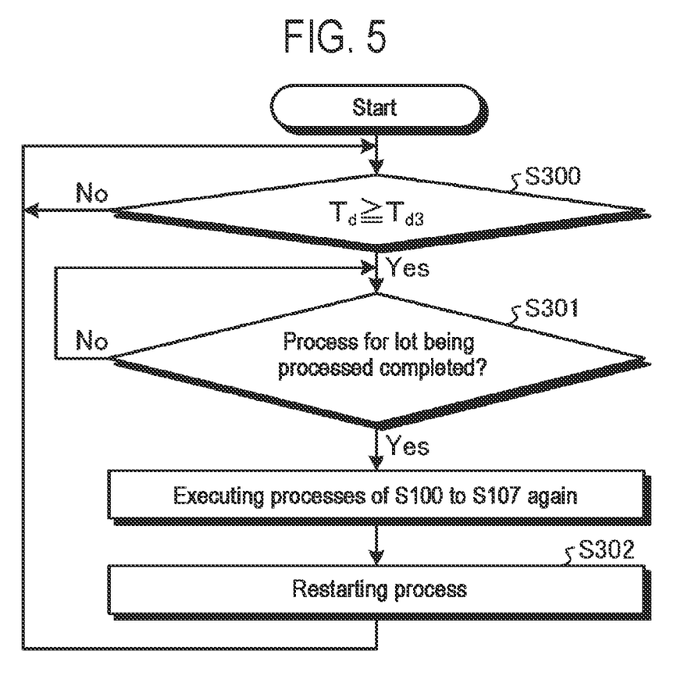
FIG. 5 is a flowchart showing an example of a method of controlling a dew-point temperature in a container during the execution of a process.

FIG. 5 is a flowchart showing an example of a method of controlling the dew-point temperature in the container 201 during the execution of a process. For example, when the process is started, the control device 130 starts a process shown in this flowchart.

First, the determination part 131 of the control device 130 determines whether or not the dew-point temperature $T_d$ is equal to or higher than a predetermined third temperature $T_{d3}$, based on the dew-point temperature $T_d$ output from the dew-point meter 204 (S300). The third temperature $T_{d3}$ is, for example, a temperature that is equal to or higher than the second temperature $T_{d2}$. When the dew-point temperature $T_d$ is lower than the third temperature $T_{d3}$ ("No" in S300), the process shown in step S300 is executed again.

On the other hand, when it is determined that the dew-point temperature $T_d$ is equal to or higher than the third temperature $T_{d3}$ ("Yes" in S300), the determination part 131 notifies the controller 132 that the dew-point temperature $T_d$ is equal to or higher than the third temperature $T_{d3}$. The controller 132 interrupts the take-out of a substrate W included in a new lot from the carrier C and determines whether or not the process for the substrate W contained in the lot being transferred and being processed is completed (S301). When the process for the substrate W included in the lot being processed is not completed ("No" in S301), the process for the substrate W contained in the lot being processed is continuously executed, and the process shown in step S300 is executed again.

On the other hand, when the process for the substrate W included in the lot being processed is completed ("Yes" in S301), the control device 130 again executes the processes of steps S100 to S107 described in FIG. 3. As a result, the dew-point temperature $T_d$ of the gas in the container 201 becomes the first temperature $T_{d1}$ or lower again. Then, the control device 130 restarts taking out a substrate W included in the next lot from the carrier C, and restarts the process for the substrate W (S302). Then, the process shown in step S300 is executed again.

As a result, even after the process for the substrate W is started, the moisture adhering to the substrate W can be kept low. Further, in step S301, the end of the process is determined in lot units, but the end of the process may be determined in units of substrate W. That is, when it is determined in step S300 that the dew-point temperature $T_d$ is equal to or higher than the third temperature $T_{d3}$, even if the lot is the same as that of the substrate W being transferred or being processed, the taking-out of a new substrate W from the carrier C may be interrupted. As a result, even on the way of the lot, the dew-point temperature $T_d$ of the gas in the container 201 can be quickly restored to the first temperature $T_{d1}$ or lower as soon as the process for the substrate W being transferred or being processed is completed.

It should be considered that the embodiments disclosed this time are exemplary and are not restrictive in all respects. Indeed, the above-described embodiments can be embodied in a variety of forms. Moreover, the above-described embodiment may be omitted, replaced, or changed in various forms without departing from the attached claims and the gist thereof.

EXPLANATION OF REFERENCE NUMERALS

C: carrier, G1: gate valve, G2: gate valve, G3: gate valve, W: substrate, 100: film forming system, 101: process chamber, 102: load lock chamber, 103: atmosphere transfer chamber, 104: alignment chamber, 105: port, 106: transfer device, 110: gas supply device, 111: PCV, 112: gas source, 113: pipe, 120: exhaust device, 121: TMP, 122: DP, 123: valve, 124: valve, 125: valve, 126: pipe, 127: pipe, 130: control device, 131: determination part, 132: controller, 200: vacuum transfer device, 201: container, 202: transfer device, 203: heater, 204: dew-point meter

What is claimed is:

1. A vacuum transfer device that is arranged between a process chamber and a load lock chamber and transfers a substrate between the process chamber and the load lock chamber, comprising:
   a container connected to each of the process chamber and the load lock chamber via a gate valve;
   a transfer device provided inside the container and configured to transfer the substrate between the process chamber and the load lock chamber;

an exhaust device configured to exhaust a gas in the container and including a turbo molecular pump and a dry pump;

a dew-point meter configured to measure a dew-point temperature of the gas in the container;

a gas supply device configured to supply an inert gas into the container and including a pressure control valve; and a control device configured to determine whether or not a process is ready to be executed, based on the dew-point temperature measured by the dew-point meter, and when the process is ready to be executed, notify a user of the vacuum transfer device that the process is ready to be executed, wherein the control device includes:
- a determination part configured to determine whether or not the dew-point temperature is equal to or lower than a predetermined first temperature after an interior of the container is opened to atmosphere and sealed again; and
- a controller configured to notify the user that the process is ready to be executed, when all of a plurality of predetermined conditions are satisfied, including one condition that the dew-point temperature is determined to be equal to or lower than the predetermined first temperature by the determination part, and wherein the controller operates the turbo molecular pump and the dry pump to exhaust the gas in the container, stops the operation of the turbo molecular pump when an internal pressure of the container is equal to or lower than a predetermined first pressure, and controls the pressure control valve so that the internal pressure of the container becomes a second pressure higher than the predetermined first pressure while the dry pump is operating.

2. The vacuum transfer device of claim 1, wherein when the determination part determines that the dew-point temperature is equal to or higher than a predetermined second temperature while the process chamber is processing the substrate, the controller notifies an error to the user of the vacuum transfer device.

3. The vacuum transfer device of claim 2, wherein the container is provided with a heater configured to heat an inner wall surface of the container, and
wherein the controller heats the wall surface by supplying power to the heater after the interior of the container is opened to the atmosphere and sealed again.

4. The vacuum transfer device of claim 3, wherein when the determination part determines that the dew-point temperature is equal to or lower than the predetermined first temperature, the controller stops the heating of the wall surface by the heater by stopping the supply of the power to the heater.

5. The vacuum transfer device of claim 1, wherein the controller controls the pressure control valve so that the internal pressure of the container becomes higher than a pressure of the process chamber before the gate valve between the process chamber and the container is opened.

6. A method of controlling a vacuum transfer device including a container arranged between a process chamber and a load lock chamber, a transfer device provided inside the container and configured to transfer a substrate between the process chamber and the load lock chamber, an exhaust device configured to exhaust a gas in the container and including a turbo molecular pump and a dry pump, and a gas supply device configured to supply an inert gas into the container and including a pressure control valve, the method comprising:

determining whether or not a dew-point temperature of the gas in the container measured by a dew-point meter provided inside the container is equal to or lower than a predetermined first temperature after an interior of the container is opened to atmosphere and sealed again; and notifying a user of the vacuum transfer device that a process is ready to be executed, when all of a plurality of predetermined conditions are satisfied, including one condition that the dew-point temperature is determined to be equal to or lower than the predetermined first temperature, wherein the turbo molecular pump and the dry pump are operated to exhaust the gas in the container, the turbo molecular pump is stopped when an internal pressure of the container is equal to or lower than a predetermined first pressure, and the pressure control valve is controlled so that the internal pressure of the container becomes a second pressure higher than the predetermined first pressure while the dry pump is operating.

7. The vacuum transfer device of claim 1, wherein the container is provided with a heater configured to heat an inner wall surface of the container, and
wherein the controller heats the wall surface by supplying power to the heater after the interior of the container is opened to the atmosphere and sealed again.

8. The vacuum transfer device of claim 1, wherein the controller controls the pressure control valve so that the internal pressure of the container becomes higher than a pressure of the process chamber before the gate valve between the process chamber and the container is opened.

* * * * *